United States Patent
Stefanov et al.

(10) Patent No.: US 10,348,296 B2
(45) Date of Patent: Jul. 9, 2019

(54) BODY-CONTROL-DEVICE FOR A BI-DIRECTIONAL TRANSISTOR

(71) Applicant: NXP USA, Inc., Austin, TX (US)

(72) Inventors: Evgueniy Nikolov Stefanov, Vieille Toulouse (FR); Philippe Dupuy, Toulouse (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/861,200

(22) Filed: Jan. 3, 2018

(65) Prior Publication Data
US 2019/0013807 A1 Jan. 10, 2019

(30) Foreign Application Priority Data
Mar. 7, 2017 (EP) .................................... 17305240

(51) Int. Cl.
| | |
|---|---|
| *G05F 3/20* | (2006.01) |
| *G11C 5/14* | (2006.01) |
| *H03K 19/00* | (2006.01) |
| *H03K 17/687* | (2006.01) |
| *H03K 17/0814* | (2006.01) |
| *H01L 21/8234* | (2006.01) |
| *H01L 29/08* | (2006.01) |
| *H01L 29/78* | (2006.01) |

(52) U.S. Cl.
CPC . *H03K 17/6871* (2013.01); *H01L 21/823487* (2013.01); *H01L 29/086* (2013.01); *H01L 29/0878* (2013.01); *H01L 29/7813* (2013.01); *H03K 17/08142* (2013.01); *H03K 2217/0009* (2013.01); *H03K 2217/0018* (2013.01)

(58) Field of Classification Search
CPC ............... H01L 29/086; H01L 29/0878; H01L 29/7813; H03K 17/6871; H03K 17/08142
USPC ........ 327/108–112, 427, 434, 437, 534–537; 326/82, 83, 87
See application file for complete search history.

(56) References Cited

U.S. PATENT DOCUMENTS

| | | | |
|---|---|---|---|
| 7,282,406 B2 | 10/2007 | Grivna et al. | |
| 7,297,603 B2 | 11/2007 | Robb et al. | |
| 7,537,970 B2 | 5/2009 | Robb et al. | |
| 7,910,409 B2 | 3/2011 | Robb et al. | |
| 8,101,969 B2 | 1/2012 | Robb et al. | |

(Continued)

*Primary Examiner* — Tomi Skibinski

(57) ABSTRACT

A body-control-device for a bi-directional transistor, said bi-directional transistor having a first-transistor-channel-terminal, a second-transistor-channel-terminal, a transistor-control-terminal and a transistor-body-terminal. The body-control-device comprises a body-control-terminal connectable to the transistor-body-terminal of the bi-directional transistor, a first-body-channel-terminal connectable to the first-transistor-channel-terminal of the bi-directional transistor, a second-body-channel-terminal connectable to the second-transistor-channel-terminal of the bi-directional transistor, a negative-voltage-source and a switching-circuit configured to selectively provide an offset-first-circuit-path between the first-body-channel-terminal and the body-control-terminal, wherein the offset-first-circuit-path includes the negative-voltage-source such that it provides a negative voltage bias between the body-control-terminal and the first-body-channel-terminal.

11 Claims, 6 Drawing Sheets

(56) References Cited

U.S. PATENT DOCUMENTS

| | | |
|---|---|---|
| 9,443,845 B1 * | 9/2016 | Stafanov ............... H01L 29/407 |
| 2004/0227565 A1 | 11/2004 | Chen et al. |
| 2007/0132435 A1 | 6/2007 | Hasegawa et al. |
| 2007/0262810 A1 * | 11/2007 | Lee .................... H03K 19/0016 327/534 |
| 2012/0083075 A1 | 4/2012 | Robb et al. |
| 2016/0197176 A1 | 7/2016 | Stefanov et al. |
| 2017/0093151 A1 | 3/2017 | Givelin et al. |
| 2017/0338809 A1 | 11/2017 | Stefanov et al. |

* cited by examiner

BODY-CONTROL-DEVICE FOR A BI-DIRECTIONAL TRANSISTOR

BACKGROUND

The present disclosure relates to a body-control-device for a bi-directional transistor, and in particular to a body-control-device that includes a negative-voltage-source that can provide a negative voltage bias between a body-control-terminal and a first-body-channel-terminal (such as a source terminal) of the bi-directional transistor.

A bi-directional MOSFET is a device with a blocking voltage for both, positive and negative biasing. A trench gated realization includes buried p-body layer separated from a n+ source terminal with a top drift n-epi layer. Between an n+drain terminal (n+sub) and a p− body is located a bottom n-epi layer. The device structure forms two inherent pn junctions and respectively two diodes. Using an n-channel formed at the vertical Si/SiO2 interface to result in positive bias applied to the gate terminal, inverses locally the buried p-doped body. The forward and reverse blocking of the device can be defined by the space charge widths and doping, respectively in the bottom and top n-epi layers. The bi-directional device can integrate the blocking function of two serial standard mono-directional MOSFETs in one device assembled in one package with up to 4× improvement of specific Rdson (drain-source resistance when the transistor is 'on') using one gate driver circuit.

BRIEF DESCRIPTION OF THE DRAWINGS

The figures and Detailed Description that follow also exemplify various example embodiments. Various example embodiments may be more completely understood in consideration of the following Detailed Description in connection with the accompanying Drawings.

One or more embodiments will now be described by way of example only with reference to the accompanying drawings in which.

DETAILED DESCRIPTION OF THE DRAWINGS

Figure 1:
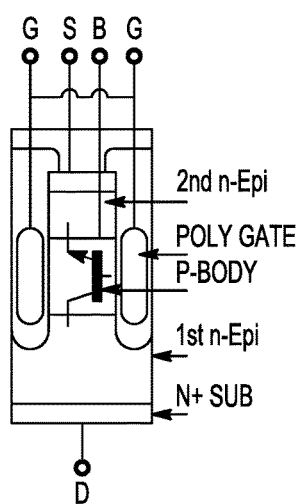
FIG. 1 shows a cross-section of MOSFET cell with a single poly gate.
Figure 2:
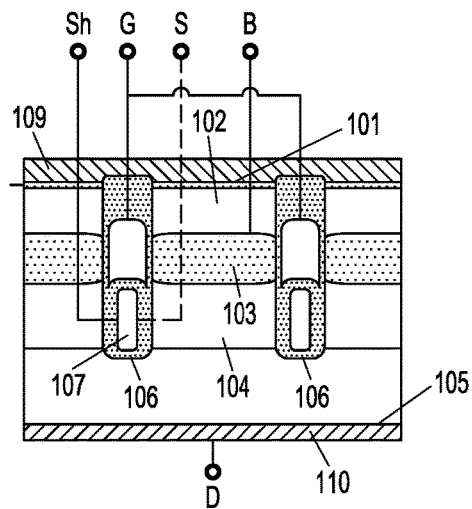
FIG. 2 illustrates a device structure that uses double poly gates.

FIGS. 1 and 2 illustrate two example vertical topologies of a bi-directional device structure.

FIG. 1 shows a cross-section of a MOSFET cell with a single poly gate. Field oxide formed in the bottom of the trench, and the recessed gate at the top, can improve a trade-off between the breakdown voltage (BV) and the Rdson of the device. The device has four electrodes, respectively: Drain (D), Source (S), Gate (G), and Body (B).

FIG. 2 illustrates a device structure that is more sophisticated than the device of FIG. 1, in that it uses double poly gates. Also, an additional 5th electrode shield gate (Sh) is formed in the bottom of the trench under the gate electrode to improve the RESURF (reduced surface field) properties of the device, and to increase its critical electrical field during breakdown, improving its trade-off BV-Rdson. The body terminal is located in the periphery of the device area. A network of metal along the area of the device relates the parallel connected body layers of all basic cells in the body terminal. An external gate driver circuit can ensure the switching during MOSFET operation. An additional body driver circuit can be used to bias and switch the body during all modes of operation. To block the device in forward mode, the body terminal can be shorted to the source and vice versa. That is, for reverse blocking, the body can be shorted to the lower potential of the drain terminal.

Figure 3:
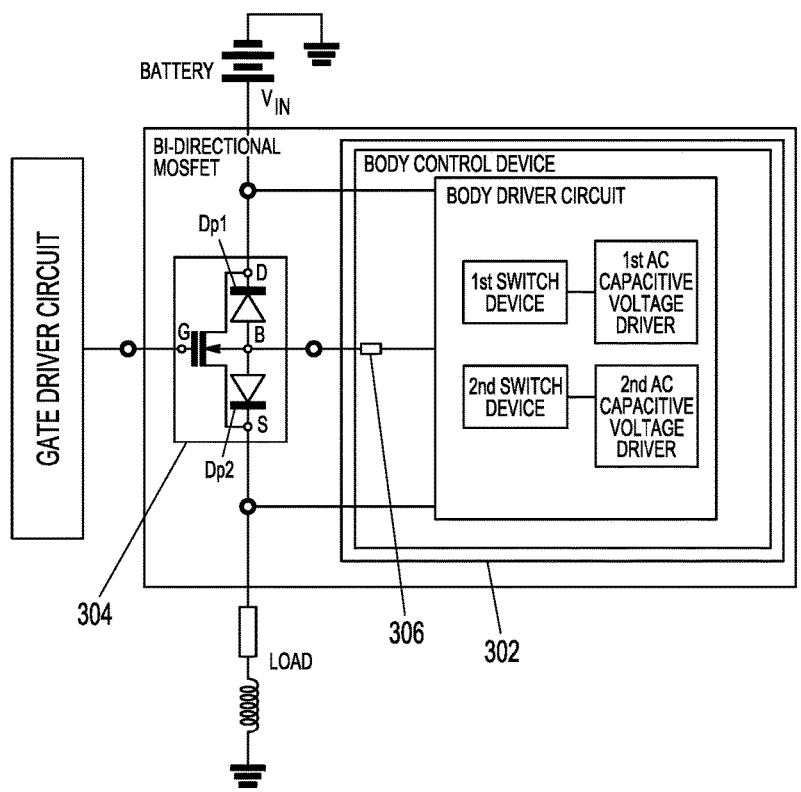
FIG. 3 shows a body drive circuit connected to a bi-directional transistor.
Figure 4:
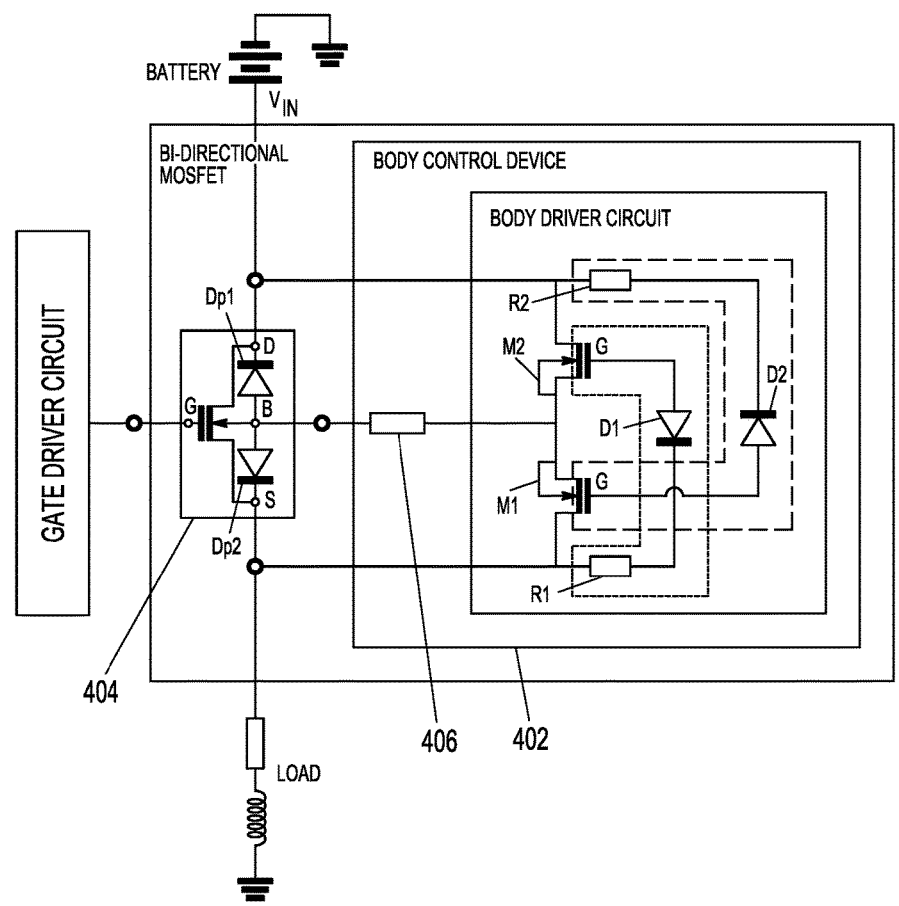
FIG. 4 shows another body drive circuit connected to a bi-directional transistor.

FIGS. 3 and 4 show body drive circuits 302, 402 connected to bi-directional transistors 304, 404. In these circuits, 1$^{st}$ and 2$^{nd}$ switch devices are used for fast switching the body terminal of the bi-directional transistors 304, 404, which can reduce the likelihood of drain-source leakage current in a standby mode. The gate voltage of the body's switch devices (M1, M2 in FIG. 4) is limited by a capacitance, which is implemented in FIG. 4 by diodes (D1, D2) operating in reverse mode. This control acts as an AC capacitive voltage divider of the input voltage $V_{IN}$. As depicted in FIG. 4, the AC capacitor voltage divider is used to limit the Vgs (gate-source voltage) bias that is applied to the gates of both n-MOSFET switches (M1, M2), which can be integrated on a control die.

Also shown in FIGS. 3 and 4 is a resistor 306, 406 that connects the switching elements (M1, M2 in FIG. 4) to the body terminal of the bi-directional transistor, in order to make the body current along the device area uniform, by reducing/minimizing the current focalization in a small area, and to reduce the likelihood of premature destructive events due to parasitic bipolar switch during a fast rate of change of voltage (dV/dt).

Some applications can impose specific performance requirements for the device: for instance, to sustain strong energies when used as a clamped inductive switch (CIS) by avoiding snapback of output I-V characteristics. For example, automotive applications can use a bi-directional device as a fuse, for relay replacement, for battery charging, etc. As will be discussed below, the triggering of the device output characteristics as a result of fast CIS turn-off can undesirably lower the specified blocking voltage, and can cause undesired current focalization in small device area and potentially, premature fails.

During fast turn-off and high dV/dt, the bi-directional transistor can be sensitive to the current and voltage rates. This can be due to the inherent bipolar vertical npn structure between drain-body-source layers (as shown in FIG. 1). Compared to a mono-directional MOSFET, the body electrode is separated from the source electrode (or the drain electrode for reverse mode of operation), as can be seen from the cross-section of the device, as shown in FIGS. 1 and 2. Also, additional body resistance (metal networking) is added between the body layer contact to each basic cell and the body terminal. That is, in addition to the intrinsic body resistance, the network of metal resistance presents non-negligible external resistance—for example several hundred milli-ohms. Non-uniformity of this distributed resistance can cause different voltage drops during strong current $I_{DB}$, thereby lowering the potential barrier between source and drain. As a result, the device blocking voltage can be sensitive to strong dV/dt rating, and can exhibit undesired snapback of its Id-Vds (drain-current versus drain-source-voltage) characteristics for strong body currents. The BV after snapback is in fact BVceo (breakdown voltage collector/emitter base open (floating)) and could be largely less than the BVcbo (breakdown voltage collector/base emitter open (floating)) of the parasitic npn transistor.

When the Source-Body junction barrier is below some critical value (for example, less than 0.5V) strong current is injected to the source, which can cause triggering of I-V output characteristics and degradation of the blocking voltage below a specified level ($BV=BV_{CEO}<BV_{CBO}$). It can therefore result in current focalization and premature device destruction. The failures are located at cells with local potential barrier Body/Source (Base/Emitter) lowering and strongly related with the voltage drop through the Body resistance RB at high Body current $I_B$.

One or more of the examples described below can advantageously increase the body-source barrier using a negative-voltage-source, which may be implemented as a charge pump. In some examples, the negative-voltage-source is triggered by a gate driver circuit associated with the bi-directional transistor. This voltage source can be applied between the source and body terminals of the bidirectional transistor to provide reverse biasing $V_{BS}$. Such reverse biasing can decrease the impact of non-uniform body distributed resistance on bipolar triggering caused during fast dV/dt and turn-off, and therefore can improve the device performance and its robustness.

Figure 5:
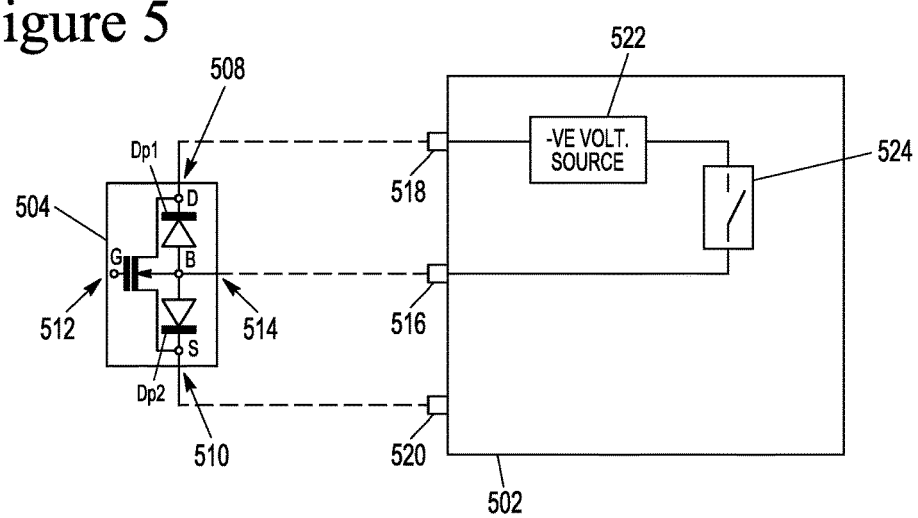
FIG. 5 shows an example embodiment of a body-control-device, for a bi-directional transistor, which includes a negative-voltage-source.

FIG. 5 shows an example embodiment of a body-control-device 502, for a bi-directional transistor 504, which includes a negative-voltage-source 522.

The bi-directional transistor 504, which may also be referred to as a bi-directional power transistor, has: a first-transistor-channel-terminal 508; a second-transistor-channel-terminal 510; a transistor-control-terminal 512; and a transistor-body-terminal 514. In FIG. 5, the first-transistor-channel-terminal 508 is labelled as a drain-terminal, and the second-transistor-channel-terminal 510 is labelled as a source-terminal. However, it will be appreciated that since the transistor 504 is bi-directional, the drain-terminal and the source-terminal may be reversed. The transistor-control-terminal 512 in this example is a gate-terminal.

The body-control-device 502 includes a body-control-terminal 516, which is connectable to the transistor-body-terminal 514; a first-body-channel-terminal 518, which is connectable to the first-transistor-channel-terminal 508; and a second-body-channel-terminal 520, which is connectable to the second-transistor-channel-terminal 510.

The body-control-device 502 also includes the negative-voltage-source 522 and a switching-circuit 524. The switching-circuit 524 is configured to selectively provide an offset-first-circuit-path between the first-body-channel-terminal 518 and the body-control-terminal 516, such that the offset-first-circuit-path includes the negative-voltage-source 522. In this way, the negative-voltage-source 522 can provide a negative voltage bias between the first-body-channel-terminal 518 and the body-control-terminal 516. As discussed above, inclusion of the negative-voltage-source 522 in this way can improve the robustness of the bi-directional transistor 504.

In the example shown in FIG. 5, offset-first-circuit-path is provided through the switching-circuit when the switching-circuit 524 is closed. Various options for controlling the switching-circuit will be described below.

Figure 6:
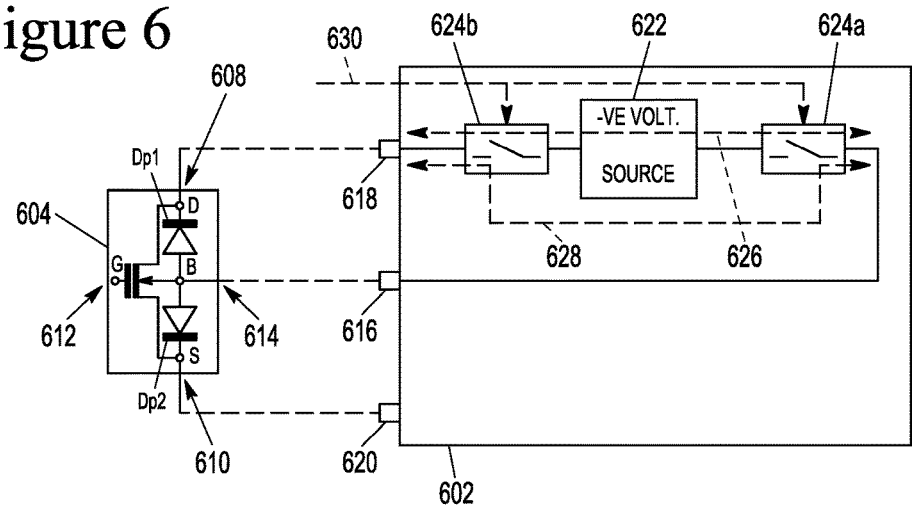
FIG. 6 shows another example embodiment of a body-control-device for a bi-directional transistor that includes a negative-voltage-source.

FIG. 6 shows another example embodiment of a body-control-device 602 for a bi-directional transistor 604. Features of FIG. 6 that are also shown in FIG. 5 will not necessarily be described again here.

In this example, the switching-circuit is provided as two switches 624a, 624b, and is configured to selectively provide either: (i) an offset-first-circuit-path 626 between the first-body-channel-terminal 618 and the body-control-terminal 616, such that the offset-first-circuit-path includes the negative-voltage-source 622; or (ii) a non-offset-first-circuit-path 628 between the first-body-channel-terminal 618 and the body-control-terminal 616, wherein the non-offset-first-circuit-path excludes the negative-voltage-source 622.

In this example, the switching-circuit 624a, 624b provides the offset-first-circuit-path 626 or the non-offset-first-circuit-path 628, based on a state of an offset-control-signal 630. The offset-control-signal 630 can be representative of an operating-mode of the bi-directional transistor 604, such as:

a forward-operating-mode (in which the first-transistor-channel-terminal 608 functions as a drain-terminal, and the second-transistor-channel-terminal 610 functions as a source-terminal);

a reverse-operating-mode (in which the first-transistor-channel-terminal 608 functions as a source-terminal, and the second-transistor-channel-terminal 610 functions as a drain-terminal);

a transistor-on-mode (in which current is allowed to flow between the first-transistor-channel-terminal 608 and the second-transistor-channel-terminal 610); and a transistor-off-mode (in which current is impeded from flowing between the first-transistor-channel-terminal 608 and the second-transistor-channel-terminal 610).

Furthermore, the offset-control-signal 630 may also be representative of transitions between the aforementioned modes, such as a transition between transistor-off-mode and transistor-on-mode, or vice versa, or a reverse in polarity across the first-transistor-channel-terminal 608 and the second-transistor-channel-terminal 610. Transitions between the operating modes correspond to a fast rate of change of voltage (dV/dt).

The offset-control-signal 630 can cause: (i) the negative-voltage-source 622 to be included when the bi-directional transistor 604 is in the reverse-operating mode, and (ii) the negative-voltage-source 622 to be excluded when the bi-directional transistor 604 is in the forward-operating mode. In some examples, the offset-control-signal 630 can also cause the negative-voltage-source 622 to be included when the bi-directional transistor 604 is in the transistor-off-operating mode. The offset-control-signal 630 can also selectively include/exclude the negative-voltage-source 622 in advance of, during or following transitions between the aforementioned modes.

In some examples, a state of the offset-control-signal 630 can correspond to a state of a signal received at the transistor-control-terminal 612 of the bi-directional transistor 604. For instance, a gate-driver-circuit (not shown) for the bi-directional transistor 604 can set both: a state of a gate-signal for the transistor-control-terminal 612; and a state of the offset-control-signal 630, such that the offset-control-signal 630 has a value that corresponds to the gate-signal. For instance, the offset-control-signal 630 can have the same polarity as the gate-signal (they are either both high, or both low), or the offset-control-signal 630 can have the opposite polarity to the gate-signal (one is high, and the other is low). Either way, the values of the two signals can be said to correspond to each other. The gate-signal is an example of a transistor-driver-signal.

In some examples, a gate-driver-circuit can provide the gate-signal such that it has a transition that is delayed relative to a corresponding transition in the offset-control-signal 630, or vice versa. The delay may be a predetermined delay period. In this way, the negative-voltage-source 622 may be selectively included/excluded: (i) prior to a transition between operating modes, (ii) during a transition between operating modes, (iii) for the duration of an instance of an operating mode, or (iv) following a transition between operating modes. This can provide continuous protective operation of the bi-directional transistor 604 while reducing power consumption relative to a constant, fixed bias negative-voltage-source 622 during all modes of operation.

The circuit of FIG. 6 can therefore provide for the negative-voltage-source 622 to either be included in, or excluded from, a circuit path between the first-body-channel-terminal 618 and the body-control-terminal 616. In particular, the negative-voltage-source 622 can be included in the circuit path to the first-transistor-channel-terminal 608, when the first-transistor-channel-terminal 608 functions as a source-terminal. The negative-voltage-source 622 can be excluded from the circuit path to the first-transistor-channel-terminal 608, when the first-transistor-channel-terminal 608 functions as a drain-terminal.

It will be appreciated that the body-control-device 602 can optionally include a second-negative-voltage-source (not shown), and that the switching-circuit can be configured to selectively provide either: (i) an offset-second-circuit-path between the second-body-channel-terminal 620 and the body-control-terminal 616, such that the offset-second-circuit-path includes the second-negative-voltage-source; or (ii) a non-offset-second-circuit-path between the second-body-channel-terminal 620 and the body-control-terminal 616, wherein the non-offset-second-circuit-path excludes the second-negative-voltage-source. The offset-control-signal 630 may be used to control the switching-circuit for this purpose.

In a further example still, the same negative-voltage-source can be used for selective inclusion in: (i) an offset-first-circuit-path between the first-body-channel-terminal and the body-control-terminal, wherein the offset-first-circuit-path includes the negative-voltage-source such that it provides a negative voltage bias between the body-control-terminal and the first-body-channel-terminal; and (ii) an offset-second-circuit-path between the second-driver-terminal and the body-control-terminal, wherein the offset-second-circuit-path includes the negative-voltage-source such that it provides a negative voltage bias between the second-driver-terminal and the body-control-terminal. For example, the negative-voltage-source 622 may be connected between the body-control-terminal 616 and the switching circuit. The switching circuit may then selectively connect the negative-voltage-source to either the first-body-channel-terminal 618 or the second-body-channel-terminal 620 in response to the offset-control-signal 630.

In some embodiments, the negative-voltage-source 622 may itself include a switching-circuit such that the negative-voltage-source 622 may be configured to receive the offset-control-signal 630 directly. In these embodiments, the negative-voltage-source 622 may provide either an offset-circuit-path or a non-offset-circuit-path between its terminals.

An advantage of an embodiment such as that disclosed in FIG. 6 is to save power by only including the negative-voltage-source when the bi-directional transistor is switched off.

Figure 7:
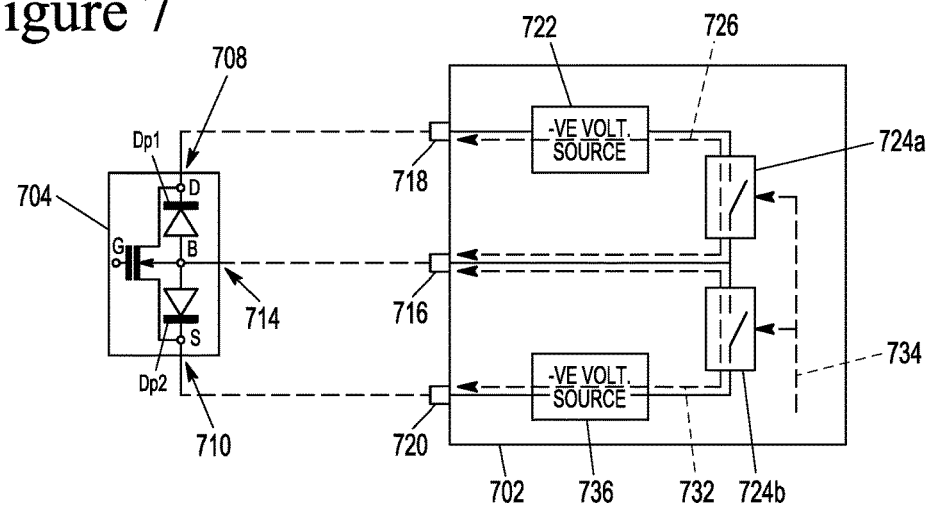
FIG. 7 shows a yet further example embodiment of a body-control-device for a bi-directional transistor that includes a negative-voltage-source.

FIG. 7 shows another example embodiment of a body-control-device 702 for a bi-directional transistor 704. Features of FIG. 7 that are also shown in FIG. 5 or FIG. 6 will not necessarily be described again here.

In this example, the switching-circuit is provided as two switches 724a, 724b, and is configured to selectively provide either: (i) an offset-first-circuit-path 726 between the first-body-channel-terminal 718 and the body-control-terminal 716, such that the offset-first-circuit-path 726 includes the negative-voltage-source 722; or (ii) a second-circuit-path 732 between the second-body-channel-terminal 720 and the body-control-terminal 716. The negative-voltage-source 722 is not included in the second-circuit-path 732.

In this example, the switching-circuit 724a, 724b provides the offset-first-circuit-path 726 or the second-circuit-path 732, based on a state of a switch-control-signal 734. The switch-control-signal 734 can be representative of a difference between the voltage levels at (i) the first-body-channel-terminal 718, and (ii) the second-body-channel-terminal 720. For example, this difference between the voltage levels may be indicative of which of the 708 and 710 is operating as a source-terminal, and which is operating as a drain-terminal. The switch-control-signal 734 can then operate the switching-circuit 724a, 724b such that the source-terminal (first-transistor-channel-terminal 708 or second-transistor-channel-terminal 710) of the bi-directional transistor 704 is connected to the transistor-body-terminal 714, through the body-control-device 702. In some examples, the switch-control-signal 734 can be generated by the switching-circuit 724a, 724b itself, such that it is a signal that is internal to the switching-circuit 724a, 724b.

The body-control-device 702 of FIG. 7 can optionally include a second-negative-voltage-source 736 that can be included in the second-circuit-path 732, in which case the second-circuit-path 732 can be referred to as an offset-second-circuit-path 732. Also, the body-control-device 702 of FIG. 7 can optionally include a switching-circuits such as the one illustrated in FIG. 6 connected to either or both of the 718, 720. In this way, the body-control-device 702 can provide one or more of: an offset-first-circuit-path; a non-offset-first-circuit-path; an offset-second-circuit-path; and a non-offset-second-circuit-path.

Figure 8:
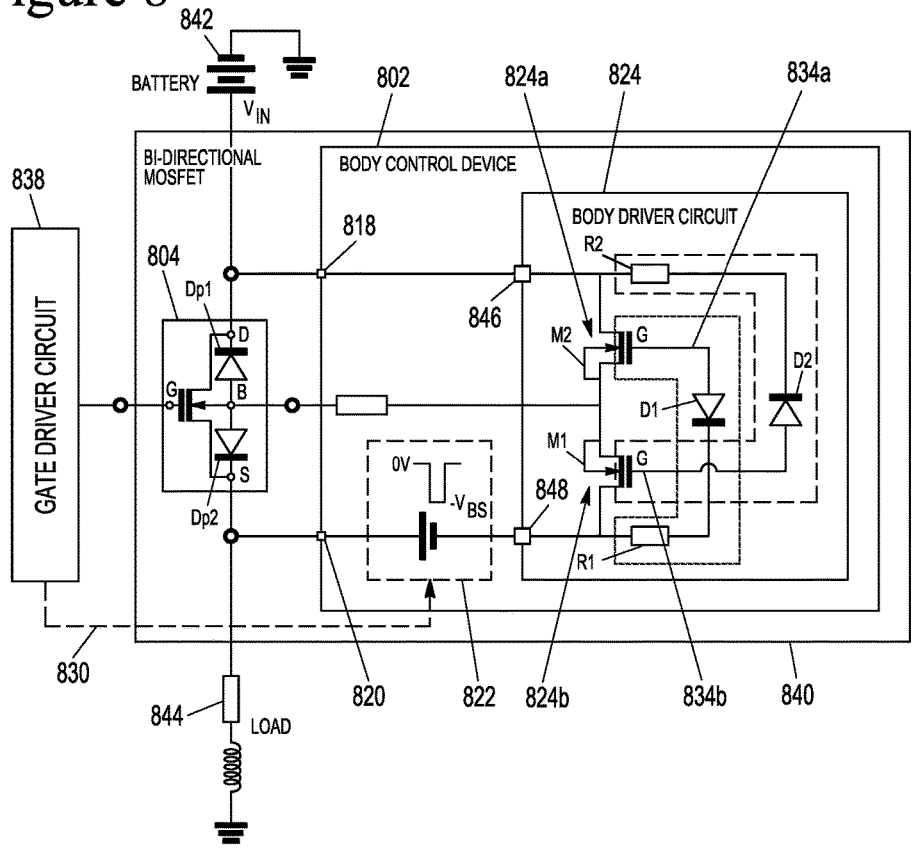
FIG. 8 shows an example embodiment of a bi-directional-transistor-circuit.

FIG. 8 shows an example embodiment of a bi-directional-transistor-circuit 840, which is connected to a battery 842 and a load 844, and is controlled by a gate-driver-circuit 838 (which is an example of a transistor-driver-circuit).

The bi-directional-transistor-circuit 840 includes a bi-directional transistor 804 and a body-control-device 802. The body-control-device 802 includes a negative-voltage-source 822 and a switching-circuit 824. The switching-circuit 824 is the same as the body driver circuit shown in FIG. 4, and includes a first-switch 824a and a second-switch 824b. The switching circuit 824 generates switch-control-signals 834a, 834b for the first-switch 824a and a second-switch 824b, depending upon the voltage difference between a first-switching-circuit-terminal 846, connected to the first-body-channel-terminal 818, and a second-switching-circuit-terminal 848, connected to the negative-voltage-source 822. The negative-voltage-source 822 is in turn connected to the second-body-channel-terminal 820. In this way, the switching-circuit 824 automatically connects the source-terminal of the bi-directional transistor 804 to the body-terminal of the bi-directional transistor 804.

In this example, the negative-voltage-source 822 can provide a variable voltage bias level of either 0V or $-V_{BS}$. $-V_{BS}$ may be $-3V$, or any other value. The negative-voltage-source 822 receives an offset-control-signal 830 from the gate-driver-circuit 838. As will be appreciated from the above description, the offset-control-signal 830 can control the negative-voltage-source 822 (for instance via a switching-circuit) such that it: (i) provides a voltage bias level of $-V_{BS}$ when a gate-signal is set to switch the bi-directional transistor 804 off; and (ii) provides a voltage bias level of 0V when the gate-signal is set to switch the bi-directional transistor 804 on.

In this way, the circuit of FIG. 8 can include the negative-voltage-source 822 between the source-terminal of the bi-directional transistor 804 and the body-control-device 802, to provide reverse biasing with a voltage level ($V_{BS}$) of either 0V or $-3V$. It can therefore advantageously increase the potential barrier $D/S_b$ $\Phi$ from 0.7V @$V_{BS}=0V$; to 3.7V @$V_{BS}=-3V$. As indicated above the negative-voltage-source 822 (BS voltage supply) can be constant during all operation modes of the device (to provide a fixed voltage bias level), or can provide a variable voltage bias level. Such a variable voltage bias level is shown in FIG. 8 because the negative-voltage-source can be triggered by the gate-driver-circuit 838 according to a mode of operation of the bi-directional transistor 804.

In some examples, any of the negative-voltage-sources 822 disclosed herein could provide three or more different voltage bias levels. The input signal to set $V_{BS}$ to either 0 or $-V_{BS}$ can be a gate driver command and can depend on the gate voltage $V_{GS}$. That is, the voltage bias level provided by the negative-voltage-source can be set by the gate-signal, which also controls the gate voltage $V_{GS}$ at the transistor-control-terminal.

Figure 9:
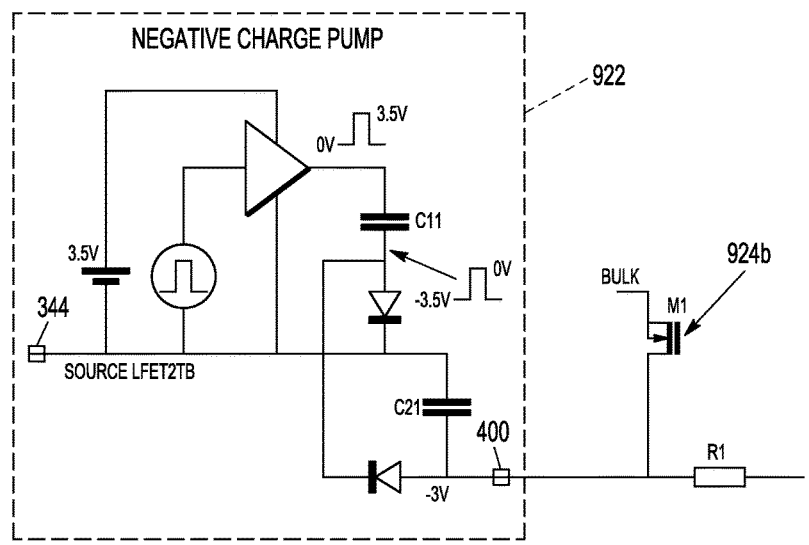
FIG. 9 shows an example implementation of a negative-voltage-source, such as the one illustrated in FIG. 8.

FIG. 9 shows an example implementation of a negative-voltage-source 922, such as the one illustrated in FIG. 8. The negative-voltage-source 922 is shown connected to a second-switch 924b, such as the one shown in FIG. 8.

The negative-voltage-source 922 in this example is based on a charge pump circuitry for generating $-3V$ between the body and source terminals of the bi-directional transistor (not shown). The charge pump includes a capacitor C21 that is charged at $-3V$ through another capacitor C11, at a frequency provided by an oscillator. During Bi-directional MOSFET switching phases, the capacitor's C21 electronic charges are used to absorb the body current. Both charge pump capacitors, as well as the oscillator frequency, are dimensioned in such a way as to keep a reasonable voltage drop across C21 during switching and then ensure a desired potential barrier between the body and source of the bi-directional transistor.

Figure 10:
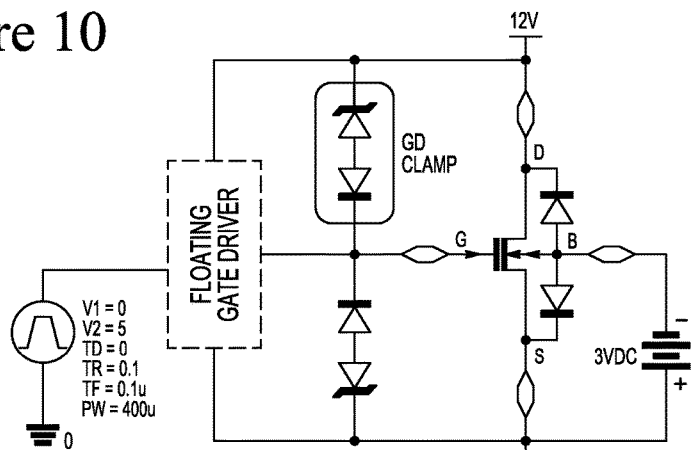
FIG. 10 shows an equivalent circuit of the bi-directional-transistor-circuit of FIG. 8, used as a clamped inductive switch (CIS), used to run the test simulations of FIGS. 11 and 12.
Figure 11:
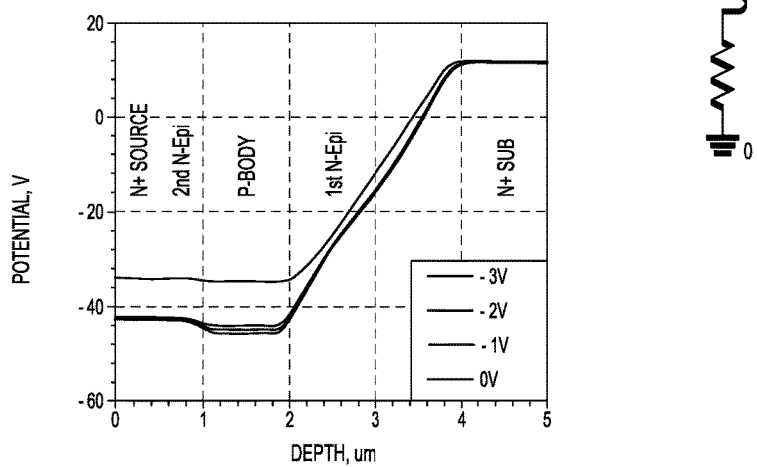
FIGS. 11 and 12 show results of the test simulations.
Figure 12:
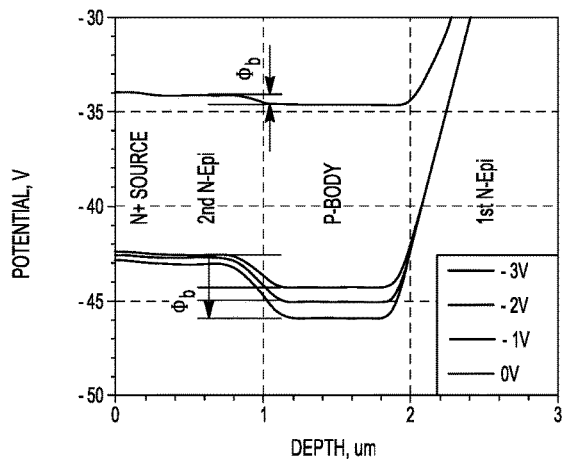

FIG. 10 shows an equivalent circuit of the bi-directional-transistor-circuit of FIG. 8, used as a clamped inductive switch (CIS), which was used to run test simulations. FIGS. 11 and 12 show results of the test simulations.

FIG. 11 illustrates the drain-source potential after CIS turn-off for WS=0, $-1$, $-2$, and $-3V$. FIG. 12 is a zoomed view of FIG. 11, and illustrates the potential barrier of the body-source junction as a function of the reverse bias $V_{BS}$.

Bi-directional MOSFET 5 mohms@BV=45V was tested for HS configuration CIS with load values: $R_L=0.1$ ohm and L=0.5 mH, $I_{DS}=8$ A and clamps $V_{GD}=27.6V$, $V_{GS}=10V$. The supply voltage was $V_{bat}=12V$. If the body terminal of the bi-directional transistor is connected to the source terminal, with a 0V bias voltage applied, then this resulted in triggering of the output $I_{DS}$-$V_{DS}$ characteristics during the turn-off phase with holding voltage $V_H=25V$, corresponding to $BV_{ceo}$ of the parasitic bipolar transistor. This causes the device to be destroyed because the current was focalized during the dissipation of the energy in the off-state mode. The failure location was found to correspond to the location where the body resistance is a maximum due to the layout topology of the body external resistance network.

Figure 13A:
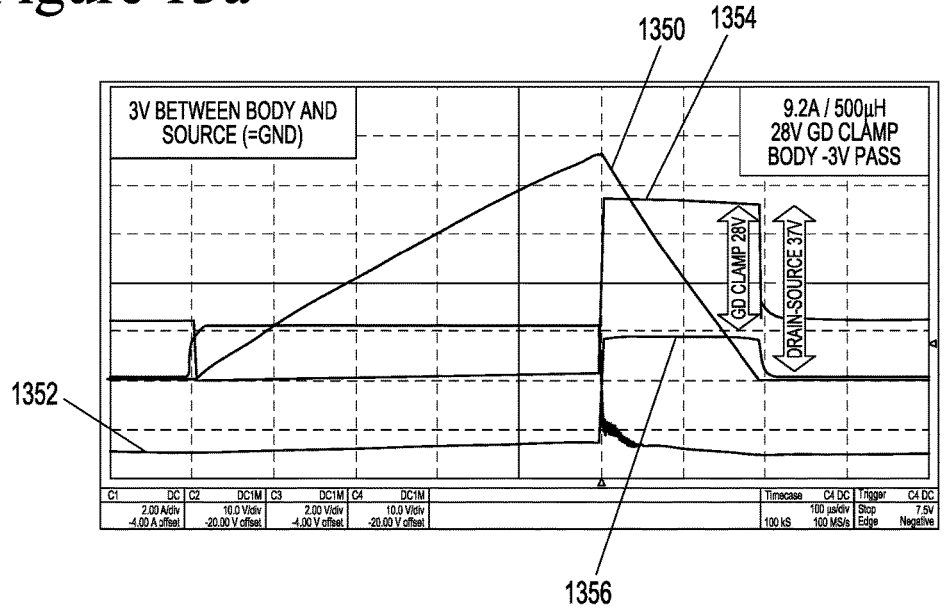
FIG. 13a shows the results of a test on a device, in CIS conditions, applying a constant body-source reverse biasing voltage, $V_{BS}=-3V$.

FIG. 13a shows the results of a test on the same device, in the same CIS conditions, applying a constant body-source reverse biasing voltage, $V_{BS}=-3V$. The waveforms of ID (1350), $I_B$ (1352), $V_D$ (1354), $V_G$ (1356), are shown. The device passed the test with Energy=320 mJ, Ids=30 A and Vds=35V, which is larger than the holding voltage measured in a previous test with $V_H=25V$ and the static $BV_{ceo}$.

Figure 13B:
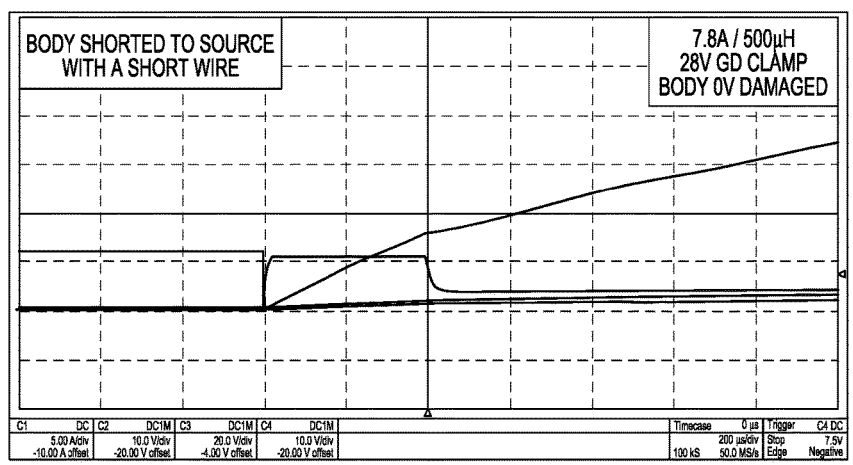
FIG. 13b shows the results of a test on the same device that was tested to produce the results of FIG. 13a, with $V_{BS}=0V$.

FIG. 13b shows the results of a test on the same device that was tested to produce the results of FIG. 13a, in the same CIS conditions, but this time with the body terminal shorted to the source terminal with a shorting wire (that is, $V_{BS}=0V$). The test of FIG. 13b shows that the bi-directional transistor was damaged.

FIGS. 13a and 13b show that when the body potential is forced to 3V below the source potential, a higher gate-to-drain voltage can be achieved:

28V (37V source-to-drain) with $V_{BS}=-3V$
21V (26V source-to-drain) with $V_{BS}=0V$ This example, and other tests performed on samples, shows the capability of the device to sustain high dV/dt during CIS without bipolar triggering with maximum energy. This can improve the device robustness and can allow desired performances of the device to be achieved. At the same time, the device sensitivity to triggering during fast turn-off from non-uniformities of a body metal resistance network can be significantly decreased.

One or more of the examples disclosed herein can protect against I-V triggering, high current injection in the body terminal, and non-uniformity of a body distributed resistance. A body driving circuit can include a Body driver negative voltage source (charge pump) for reverse biasing between body-source (or body-drain) junction. A negative body-source voltage source between the source and the body driver circuit, reverse biasing the body (0V>Vbs>=$-3V$) with respect to the source (and/or drain) electrodes can be particularly advantageous for automotive applications.

Examples disclosed herein can be used for fuse and relay replacement, battery charging, E-switch and power management, as non-limiting examples.

According to a first aspect of the present disclosure there is provided a body-control-device for a bi-directional transistor, said bi-directional transistor having:
a first-transistor-channel-terminal;
a second-transistor-channel-terminal;
a transistor-control-terminal; and
a transistor-body-terminal
the body-control-device comprising:

a body-control-terminal connectable to the transistor-body-terminal of the bi-directional transistor;

a first-body-channel-terminal connectable to the first-transistor-channel-terminal of the bi-directional transistor;

a second-body-channel-terminal connectable to the second-transistor-channel-terminal of the bi-directional transistor;

a negative-voltage-source; and a switching-circuit configured to selectively provide an offset-first-circuit-path between the first-body-channel-terminal and the body-control-terminal, wherein the offset-first-circuit-path includes the negative-voltage-source such that it provides a negative voltage bias between the body-control-terminal and the first-body-channel-terminal.

In one or more embodiments, the switching-circuit is configured to selectively provide a second-circuit-path between the second-body-channel-terminal and the body-control-terminal.

In one or more embodiments, the switching-circuit is configured to provide the offset-first-circuit-path or the second-circuit-path, based on a state of a switch-control-signal. The switch-control-signal may be representative of a difference between the voltage levels at (i) the first-body-channel-terminal, and (ii) the second-body-channel-terminal.

In one or more embodiments, the switching-circuit is further configured to selectively provide a non-offset-first-circuit-path between the first-driver-terminal and the body-control-terminal, wherein the non-offset-first-circuit-path excludes the negative-voltage-source.

In one or more embodiments, the switching-circuit is configured to provide the offset-first-circuit-path or the non-offset-first-circuit-path between the first-driver-terminal and the body-control-terminal, based on a state of an offset-control-signal. The offset-control-signal may be representative of an operating-mode of the bi-directional transistor.

In one or more embodiments, the offset-control-signal is representative of a forward-operating-mode or a reverse-operating-mode of the bi-directional transistor.

In one or more embodiments, the offset-control-signal is representative of a transistor-on-mode or a transistor-off-mode. The switching-circuit may be configured to provide the offset-first-circuit-path when the offset-control-signal is representative of the transistor-off-operating mode.

In one or more embodiments, the offset-control-signal corresponds to a signal received at the transistor-control-terminal of the bi-directional transistor.

In one or more embodiments, the body-control-device further comprises a transistor-driver-circuit configured to:

provide a transistor-driver-signal to the transistor-control-terminal of the bi-directional transistor;

provide the offset-control-signal to the switching-circuit; and set a state of the offset-control-signal such that it corresponds to a state of the transistor-driver-signal.

In one or more embodiments, the transistor-driver-circuit is configured to provide the transistor-driver-signal such that it has a transition that is delayed relative to a corresponding transition in the offset-control-signal, or vice versa In one or more embodiments, the negative-voltage-source is configured to provide a variable voltage bias.

In one or more embodiments, the negative-voltage-source is configured to provide three or more voltage bias levels.

In one or more embodiments, the negative-voltage-source is configured to provide a fixed voltage bias level.

In one or more embodiments, the switching-circuit is configured to selectively provide an offset-second-circuit-path between the second-driver-terminal and the body-control-terminal. The offset-second-circuit-path may include the negative-voltage-source such that it provides a negative voltage bias between the second-driver-terminal and the body-control-terminal.

In one or more embodiments, the body-control-device further comprises a second-negative-voltage-source. The switching-circuit may be configured to selectively provide an offset-second-circuit-path between the second-driver-terminal and the body-control-terminal. The offset-second-circuit-path may include the second-negative-voltage-source such that it provides a negative voltage bias between the second-driver-terminal and the body-control-terminal.

There may be provided a bi-directional-transistor-circuit that comprises any body-control-device disclosed herein, and a bi-directional transistor connected to the body-control-device.

There may also be provided an integrated circuit comprising one or more of the circuits/components disclosed herein.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A bi-directional-transistor circuit comprising: a body-control-device and a bi-directional transistor, said bi-directional transistor having:
    a first-transistor-channel-terminal;
    a second-transistor-channel-terminal;
    a transistor-control-terminal; and
    a transistor-body-terminal, and
the body-control-device comprising:
    a body-control-terminal connected to the transistor-body-terminal of the bi-directional transistor;
    a first-body-channel-terminal connected to the first-transistor-channel-terminal of the bi-directional transistor;
    a second-body-channel-terminal connected to the second-transistor-channel-terminal of the bi-directional transistor;
    a negative-voltage-source; and
    a switching-circuit configured to selectively provide an offset-first-circuit-path between the first-body-channel-terminal and the body-control-terminal, wherein the offset-first-circuit-path includes the negative-voltage-source such that it provides a negative voltage bias between the body-control-terminal and the first-body-channel-terminal,
wherein the switching-circuit is further configured to selectively provide a non-offset-first-circuit-path between the first-driver-terminal and the body-control-terminal, wherein the non-offset-first-circuit-path excludes the negative-voltage-source, and
wherein the switching-circuit is configured to provide the offset-first-circuit-path or the non-offset-first-circuit-path between the first-driver-terminal and the body-control-terminal, based on a state of an offset-control-signal, wherein the offset-control-signal is representative of a forward-operating-mode or a reverse-operating-mode of the bi-directional transistor.

2. The bi-directional-transistor circuit of claim 1, wherein the switching-circuit is configured to selectively provide a second-circuit-path between the second-body-channel-terminal and the body-control-terminal.

3. The bi-directional-transistor circuit of claim 2, wherein the switching-circuit is configured to provide the offset-first-circuit-path or the second-circuit-path, based on a state of a switch-control-signal, wherein the switch-control-signal is representative of a difference between the voltage levels at (i) the first-body-channel-terminal, and (ii) the second-body-channel-terminal.

4. The bi-directional-transistor circuit of claim 1, wherein the offset-control-signal is representative of the forward-operating-mode, reverse-operating-mode, a transistor-on-mode or a transistor-off-mode of the bi-directional transistor, and wherein the switching-circuit is configured to provide the offset-first-circuit-path when the offset-control-signal is representative of the transistor-off-operating mode.

5. The bi-directional-transistor circuit of claim 1, wherein the offset-control-signal corresponds to a signal received at the transistor-control-terminal of the bi-directional transistor.

6. The bi-directional-transistor circuit of claim 1, further comprising a transistor-driver-circuit configured to:
    provide a transistor-driver-signal to the transistor-control-terminal of the bi-directional transistor;
    provide an offset-control-signal to the switching-circuit; and
    set a state of the offset-control-signal such that it corresponds to a state of the transistor-driver-signal.

7. The bi-directional-transistor circuit of claim 6, wherein the transistor-driver-circuit is configured to provide the transistor-driver-signal such that it has a transition that is delayed relative to a corresponding transition in the offset-control-signal, or vice versa.

8. The bi-directional-transistor circuit of claim 1, wherein the negative-voltage-source is configured to provide a variable voltage bias.

9. The bi-directional-transistor circuit of claim 1, wherein the negative-voltage-source is configured to provide a fixed voltage bias level.

10. The bi-directional-transistor circuit of claim 1, wherein the switching-circuit is configured to selectively provide an offset-second-circuit-path between the second-driver-terminal and the body-control-terminal, wherein the offset-second-circuit-path includes the negative-voltage-source such that it provides a negative voltage bias between the second-driver-terminal and the body-control-terminal.

11. The bi-directional-transistor circuit of claim 1, further comprising:
    a second-negative-voltage-source, and
wherein the switching-circuit is configured to selectively provide an offset-second-circuit-path between the second-driver-terminal and the body-control-terminal, wherein the offset-second-circuit-path includes the second-negative-voltage-source such that it provides a negative voltage bias between the second-driver-terminal and the body-control-terminal.

* * * * *